(12) United States Patent
Anno

(10) Patent No.: US 8,866,782 B2
(45) Date of Patent: *Oct. 21, 2014

(54) DISPLAY DEVICE

(71) Applicants: Japan Display Inc., Chiba (JP); Panasonic Liquid Crystal Display Co., Ltd., Hyogo-ken (JP)

(72) Inventor: Kouichi Anno, Mobara (JP)

(73) Assignees: Japan Display Inc., Tokyo (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/946,434

(22) Filed: Jul. 19, 2013

(65) Prior Publication Data

US 2013/0306459 A1 Nov. 21, 2013

Related U.S. Application Data

(63) Continuation of application No. 12/572,395, filed on Oct. 2, 2009, now Pat. No. 8,493,345.

(30) Foreign Application Priority Data

Oct. 3, 2008 (JP) ................................. 2008-258053

(51) Int. Cl.
*G06F 3/041* (2006.01)
*H03K 17/96* (2006.01)
*G06F 3/044* (2006.01)
*H05K 1/11* (2006.01)

(52) U.S. Cl.
CPC ............ *H03K 17/9622* (2013.01); *G06F 3/044* (2013.01); *H05K 2201/10128* (2013.01); *H05K 1/118* (2013.01); *H05K 2201/09254* (2013.01); *H05K 2201/09781* (2013.01); *G06F 2203/04111* (2013.01); *H05K 2201/09245* (2013.01)
USPC ..................... 345/173; 178/18.03; 178/19.06; 345/206

(58) Field of Classification Search
CPC ... G06F 19/3418; G06F 19/345; G06F 3/044; G06F 19/3462; G06F 19/3487; G06F 19/321; G06F 19/322; G06F 19/3402
USPC ......................................... 345/173–181, 206
See application file for complete search history.

(56) References Cited

U.S. PATENT DOCUMENTS

| 7,227,537 | B2 | 6/2007 | Nakayama et al. |
| 7,864,503 | B2 | 1/2011 | Chang |
| 8,059,015 | B2 | 11/2011 | Hua et al. |
| 2007/0079996 | A1 | 4/2007 | Lee et al. |
| 2007/0240914 | A1 | 10/2007 | Lai et al. |

FOREIGN PATENT DOCUMENTS

| JP | 2003-511799 | 3/2003 |
| WO | WO 01/27868 A1 | 4/2001 |

*Primary Examiner* — Dun Dinh
(74) *Attorney, Agent, or Firm* — Antonelli, Terry, Stout & Kraus, LLP.

(57) ABSTRACT

An electrostatic-capacitance touch panel includes of X electrodes which are formed above a front surface of the electrostatic-capacitance touch panel, Y electrodes which intersect with the X electrodes, a back-surface electrode which is formed above a back surface of the electrostatic-capacitance touch panel, X-electrode signal lines which supply signals to the X electrodes from both ends of each X electrode, Y-electrode signal lines which supply signals to the Y electrodes from both ends of each Y electrode, a flexible printed circuit board connected to the X-electrode signal lines and the Y-electrode signal lines at a connection portion, intersecting portions where the X electrodes and the Y electrodes overlap with each other, and electrode portions each of which is formed between two intersecting portions. A back-surface-connection-use terminal is formed outside of the connection portion, and the back-surface-connection-use terminal and the back-surface electrode are connected to each other using a conductive member.

16 Claims, 14 Drawing Sheets

DISPLAY DEVICE

CROSS-REFERENCE TO RELATED APPLICATION

This application is a continuation of U.S. application Ser. No. 12/572,395, filed Oct. 2, 2009, now U.S. Pat. No. 8,493,395, the contents of which are incorporated herein by reference.

The present application claims priority from Japanese application JP 2008-258053 filed on Oct. 3, 2008, the content of which is hereby incorporated by reference into this application.

BACKGROUND OF THE INVENTION

1. Field of the Invention

The present invention relates to a display device with a touch panel, and more particularly to a technique which is effectively applicable to a display device with a touch panel which includes an electrostatic-capacitance-type touch panel.

2. Description of the Related Art

Recently, a touch panel technique which assists a "user-friendly" graphical user interface has become important in the propagation of mobile equipment.

As such a touch panel technique, an electrostatic-capacitance-type touch panel has been known. With respect to such an electrostatic-capacitance-type touch panel, there has been known the touch panel which can detect a touch position touched by a viewer.

The touch panel described in JP-T-2003-511799 detects coordinates of a position touched by the viewer by detecting capacitance formed of capacitance of an electrode line in the X direction and capacitance of an electrode line in the Y direction.

SUMMARY OF THE INVENTION

An electrostatic-capacitance-type touch panel includes a plurality of Y electrodes which extends in the first direction (for example, Y direction) and is arranged parallel to each other in the second direction (for example, X direction) which intersects with the first direction, and a plurality of X electrodes which extends in the second direction while intersecting with the Y electrodes and is arranged parallel to each other in the first direction. Such a touch panel is referred to as an X-Y type touch panel. In the X-Y type touch panel, the plurality of X electrodes and the plurality of Y electrodes are stacked on a substrate with an interlayer insulation film sandwiched therebetween. These X electrodes and Y electrodes are formed using a transparent conductive material such as ITO (Indium Tin Oxide) or the like, for example.

In the X-Y type touch panel, the capacitance of electrodes on one line in a state that the touch panel is not touched by a finger or the like (in a steady state) is formed of inter-electrode capacitance which is generated between electrodes arranged adjacent to each other, intersecting-portion capacitance which is generated at an intersecting portion where electrodes orthogonally intersect with each other, capacitance to ground which is generated between the electrode and a display device arranged below the touch panel, and line capacitance which is generated in a line between a control IC and the touch panel.

The electrostatic-capacitance-type touch panel adopts a detection method in which the touch panel detects a capacitance change which occurs when a finger of a person or the like touches the touch panel and hence, it is desirable that the capacitances other than the inter-electrode capacitance are as small as possible. When the inter-electrode capacitance is larger compared to other capacitances, a sufficient capacitance ratio can be ensured when a person touches the touch panel with his/her finger or the like and hence, the performance of the touch panel is enhanced. To the contrary, when the sufficient capacitance ratio cannot be ensured, the touch panel cannot recognize that the finger or the like touches the touch panel and hence, there may be a possibility that the touch panel is erroneously operated.

As an index of detection sensitivity of the touch panel, a ratio between a capacitance change which occurs when a finger or the like touches the touch panel and background noises (hereinafter indicated as an "S/N ratio") is used. To increase the detection sensitivity, that is, an S/N ratio, it is necessary to elevate a signal level or to reduce noises.

As described previously, the signal level is proportional to capacitance formed between a finger or the like which touches the touch panel and the electrode. On the other hand, when the line capacitance or the like is increased, the capacitance change which occurs when the finger or the like touches the touch panel becomes relatively small thus worsening the S/N ratio. Further, with respect to the background noises, it is found that the fluctuation of a signal voltage which is generated when a display device performs a display is detected as noises by the electrode of the touch panel positioned directly above the display device. The larger a sum of areas of electrodes on one line of the touch panel, the larger the capacitance to ground becomes and hence, noises are easily detected. However, when an area of the electrode is decreased, the inter-electrode capacitance is also decreased thus lowering a signal level.

To suppress the influence of noises generated by the display device without lowering the signal level under such circumstances, inventors firstly studied the formation of a transparent conductive film on a back surface of a touch panel substrate as a shield layer. However, the formation of the transparent conductive film on the back surface of the substrate as the shield layer gives rise to a new drawback that it is necessary to supply a voltage to the back surface of the substrate.

Further, as a method of supplying a signal for enhancing an S/N ratio, an attempt has been made to connect both ends of each X electrode and each Y electrode of a touch panel to lines respectively. From this attempt, it is found that when a signal transmitted from a control IC is supplied to the X electrodes and Y electrodes such that the signal is supplied to each electrode from both ends thereof, an S/N ratio is enhanced. However, since the signal is supplied from both ends of each electrode, lines connected between the control IC and the touch panel extend laterally so that these lines intersect with other lines thus giving rise to a new drawback that line capacitance is increased.

Further, there also exists a drawback attributed to an external shape of the touch panel. The external shape of the touch panel which is used in an overlapping manner with the display device has the substantially equal shape as the display device. The display device usually has a rectangular shape, wherein either one of a side in the X direction and a side in the Y direction is generally longer than the other side.

In the related art, individual electrodes arranged on one line in the X direction and individual electrodes arranged on one line in the Y direction have the substantially same size, while a length of the electrode arranged on one line in the X direction and a length of the electrode arranged on one line in the Y direction differ from each other and hence, the number of individual electrodes arranged on one line differs between one line in the X direction and one line in the Y direction.

Accordingly, the capacitance generated on one line differs between the X direction and the Y direction. As an example, to consider a case where a longitudinally elongated touch panel is adopted, the capacitance corresponding to the Y electrodes arranged on one line parallel to the long-side direction becomes larger than the capacitance corresponding to the X electrodes arranged on one line parallel to the short-side direction.

Accordingly, in the touch panel of the related art where the capacitance of the electrodes on one line differs between the X direction and the Y direction, noise intensity differs between the X direction and the Y direction. That is, in the touch panel of the related art, an S/N ratio differs between the X direction and the Y direction. Such difference in the S/N ratio gives rise to a drawback that the detection sensitivity of the whole touch panel is determined based on the lower S/N ratio.

The present invention has been made to overcome the above-mentioned drawbacks of the related art, and it is an object of the present invention to provide an input device which has a large S/N ratio thus exhibiting favorable detection sensitivity.

The above-mentioned and other objects and novel features of the present invention will become apparent from the description of this specification and attached drawings.

To briefly explain the summary of typical inventions among the inventions disclosed in this specification, they are as follows.

To overcome the above-mentioned drawbacks, according to the present invention, a shield electrode is formed on a back surface of an X-Y-type touch panel for enhancing an S/N ratio. A back-surface-use connection terminal is provided for supplying a constant voltage to the shield electrode formed on the back surface of the touch panel, and the shield electrode and the back-surface-use connection terminal are connected to each other by a conductive member. Further, to overcome the drawback that signals are supplied to the X electrodes and the Y electrodes from both ends of each electrode so that the intersecting line capacitance is increased at the portion where the lines intersect with each other on the flexible printed circuit board, the present invention adopts the structure in which a line including a ground potential portion is not arranged on a back surface of a portion of a line which connects an output portion of a control IC with an electrode on a touch panel. Further, at a portion of the flexible printed circuit board where the intersection of lines is necessary, an intersecting area is minimized by allowing the lines to intersect with each other orthogonally thus preventing the increase of the line capacitance.

Further, an area of each one of Y electrodes which are arranged parallel to the long side of the touch panel is decreased, and the area of the Y electrode is set smaller than an area of each one of X electrodes which orthogonally intersects with the long side of the touch panel so as to make the capacitance on one line substantially equal between the X direction and the Y direction. Further, a floating electrode (a dummy electrode) is arranged in a portion which becomes empty due to the decrease of the area of the electrode.

To briefly explain the advantageous effects acquired by typical inventions among the inventions disclosed in this specification, they are as follows.

According to the present invention, it is possible to provide an input device which has a large S/N ratio thus exhibiting the favorable detection sensitivity.

DESCRIPTION OF THE PREFERRED EMBODIMENTS

Hereinafter, an embodiment of the present invention is explained in detail in conjunction with drawings.

Here, in all drawings for explaining the embodiment, parts having identical functions are given same symbols, and their repeated explanation is omitted.

In this embodiment, the explanation is made with respect to a case in which a liquid crystal display panel is used as one example of a display panel. Here, the present invention is applicable to any display panel which can mount a touch panel thereon. Further, the display panel is not limited to the liquid crystal display panel, and the display panel may be a display panel which uses organic light emitting diode elements (OLED) or surface conductive electron emission elements (FED).

Figure 1:
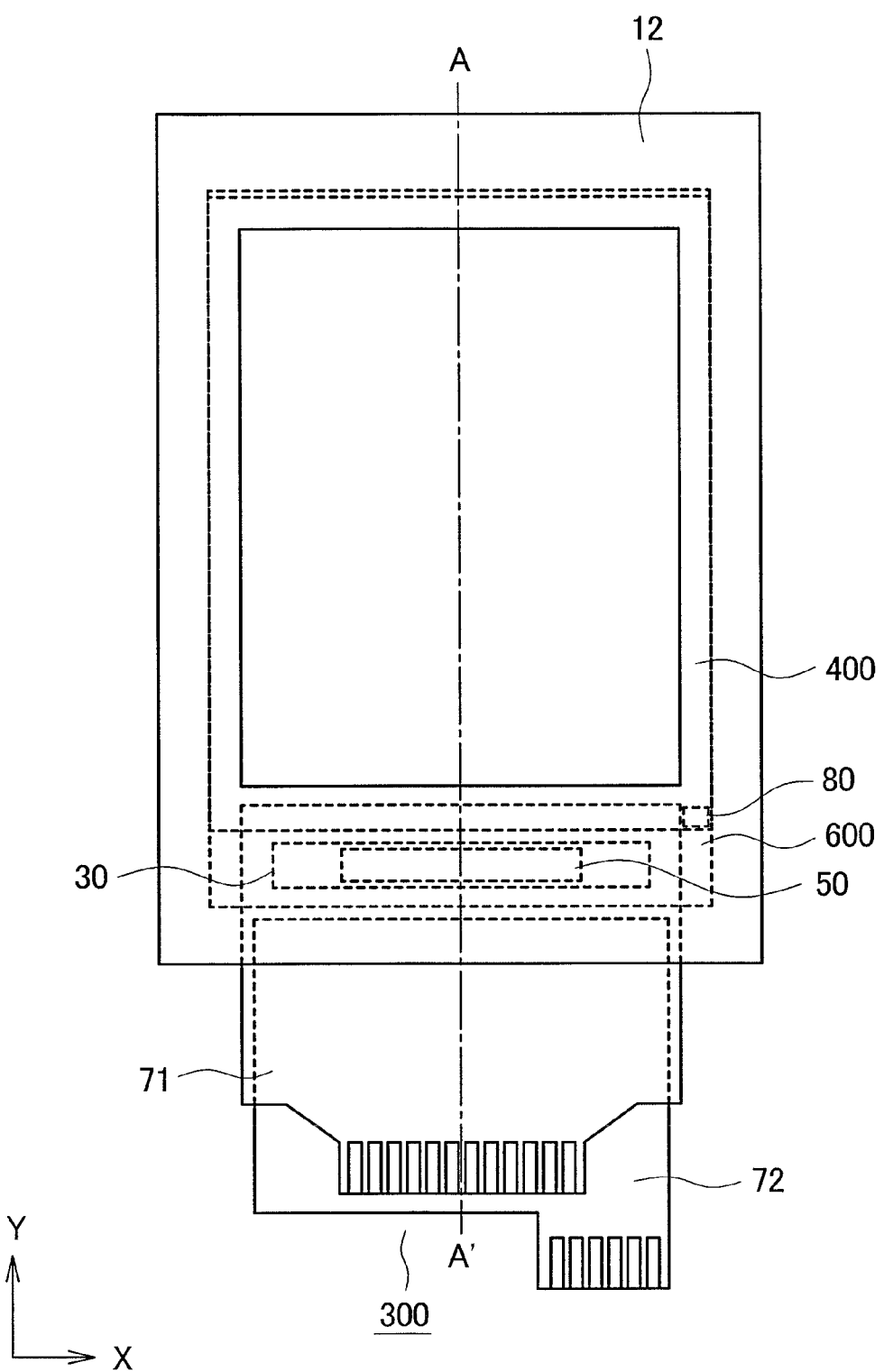
FIG. 1 is a schematic plan view of a display device according to an embodiment of the present invention.
Figure 2:
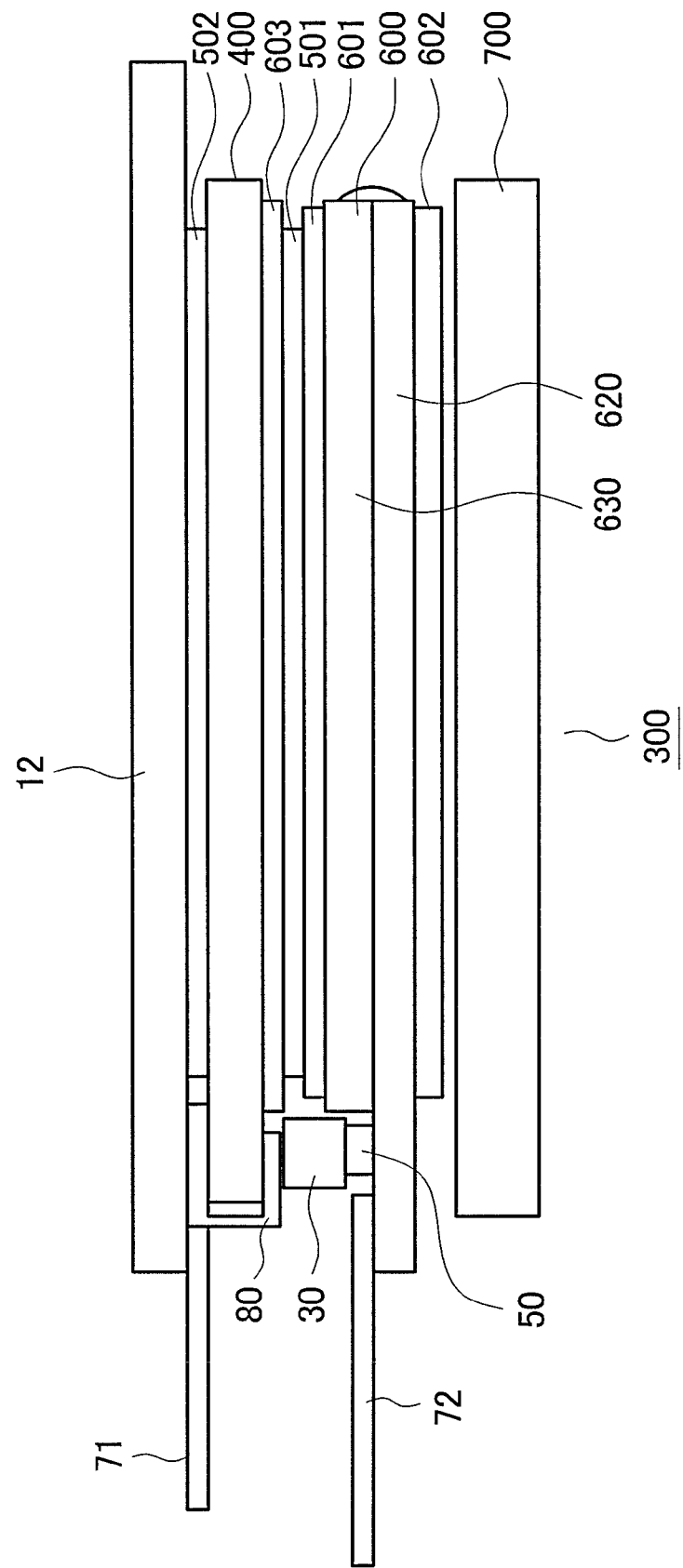
FIG. 2 is a cross-sectional view showing the cross-sectional structure taken along a line A-A' in FIG. 1.

FIG. 1 is a plan view showing the schematic constitution of a display device with a touch panel according to the embodiment of the present invention. FIG. 2 is a cross-sectional view showing the cross-sectional structure taken along a line A-A' in FIG. 1.

The display device 300 of this embodiment includes, as shown in FIG. 1 and FIG. 2, a liquid crystal display panel 600, an electrostatic-capacitance-type touch panel 400 which is arranged on a viewer's-side surface of the liquid crystal display panel 600, and a backlight 700 which is arranged on a surface of the liquid crystal display panel 600 on a side opposite to the viewer's side. As the liquid crystal display panel 600, an IPS type liquid crystal display panel, a TN type liquid crystal display panel, a VA type liquid crystal display panel or the like may be used, for example.

The liquid crystal display panel 600 is configured such that two substrates 620, 630 which are arranged to face each other in an opposed manner are adhered to each other, and a polarizer 601 is formed on an outer surface of one substrate, and a polarizer 602 is formed on an outer surface of the other substrate. Further, the liquid crystal display panel 600 and the touch panel 400 are adhered to each other using a first adhesive agent 501 formed of a resin, an adhesive film or the like. Further, a front surface protective plate (also referred to as a front window) 12 made of an acrylic resin is adhered to an outer surface of the touch panel 400 using a second adhesive agent 502 formed of a resin, an adhesive film or the like.

A transparent conductive layer 603 is formed on a liquid-crystal-display-panel side of the touch panel 400. The transparent conductive layer 603 is provided for blocking signals generated from the liquid crystal display panel 600.

A large number of electrodes is formed on the liquid crystal display panel 600, and voltages are supplied to the electrodes as signals at various timings. When the voltage of the liquid crystal display panel 600 changes, such a change generates noises which influence the electrodes formed on the electro-static-capacitance-type touch panel 400. Accordingly, it is necessary to electrically shield the touch panel 400 from the liquid crystal display panel 600 and the transparent conductive layer 603 is provided as a shield electrode. To allow the transparent conductive layer 603 to function as a shield electrode, a constant voltage is applied to the transparent conductive layer 603 from a flexible printed circuit board 71 or the like and, for example, the voltage supplied to the transparent conductive layer 603 is set to a ground potential.

The flexible printed circuit board 71 is connected to connection terminals (not shown in the drawing) formed on a surface of the touch panel 400 on which the electrodes are formed (hereinafter referred to as a front surface). On the other hand, the touch panel 400 includes conductive members 80 to supply a voltage such as a ground potential to a surface of the touch panel 400 on which the transparent conductive layer 603 is formed (hereinafter referred to as a back surface).

Here, to suppress the influence of the noises, it is desirable to set a sheet resistance value of the transparent conductive layer 603 to 150 to 200Ω/□ which is substantially equal to a sheet resistance value of the electrodes formed on the touch panel 400. It is known that a resistance value of the transparent conductive layer 603 is relevant to a size of the crystal grains. By setting a heat treatment temperature at the time of forming the transparent conductive layer 603 at 200° C. or above, the crystallization of the transparent conductive layer 603 is enhanced so that a sheet resistance value of the transparent conductive layer 603 can be set to 150 to 200Ω/□.

The resistance value of the transparent conductive layer 603 may be further lowered. For example, by setting a heat treatment temperature at the time of forming the transparent conductive layer 603 at 450° C., the transparent conductive layer 603 is sufficiently crystallized so that a sheet resistance value of the transparent conductive layer 603 can be set to 30 to 40Ω/□. When the transparent conductive layer 603 for shielding has a resistance value substantially equal to or below a resistance value of the electrodes formed on the touch panel 400, the advantageous effect of suppressing the noise can be enhanced.

The flexible printed circuit board 71 is connected to a touch panel control circuit (not shown in the drawing), and the detection of an input position or the like is controlled by the touch panel control circuit. The electrodes formed on the front surface of the touch panel 400 and the touch panel control circuit are electrically connected to each other by way of the flexible printed circuit board 71. Further, an arbitrary voltage such as a ground potential is supplied to the transparent conductive layer 603 formed on the back surface of the touch panel 400 via the flexible printed circuit board 71. The flexible printed circuit board 71 is connected to input terminals formed on the front surface of the touch panel 400 and hence, it is necessary to electrically connect the flexible printed circuit board 71 and the transparent conductive layer 603 by arranging lines which lead to the input terminals from the transparent conductive layer 603 which is formed on the back surface of the touch panel 400.

Accordingly, back-surface connection pads are arranged parallel to the input terminals, and the back-surface connection pads and the transparent conductive layer 603 formed on the back surface of the touch panel 400 are connected using the conductive members 80. The back-surface connection pads are explained in detail later.

In FIG. 2, a spacer 30 is inserted between the substrate 620 and the touch panel 400. The hybrid structure in which the touch panel 400 and the front window 12 are combined with the liquid crystal display panel 600 has a drawback that the substrate 620 of the liquid crystal display panel 600 suffers from low glass strength.

A region of the substrate 620 on which the driver circuit 50 is mounted projects horizontally from one edge of another substrate 630 so that the substrate 620 has a single plate shape. This may cause a drawback that the substrate 620 is broken in such a region where the driver circuit 50 is mounted. To prevent such breaking of the substrate 620, the spacer 30 is inserted between the substrate 620 and the touch panel 400 thus enhancing the strength of the substrate 620.

Figure 3:
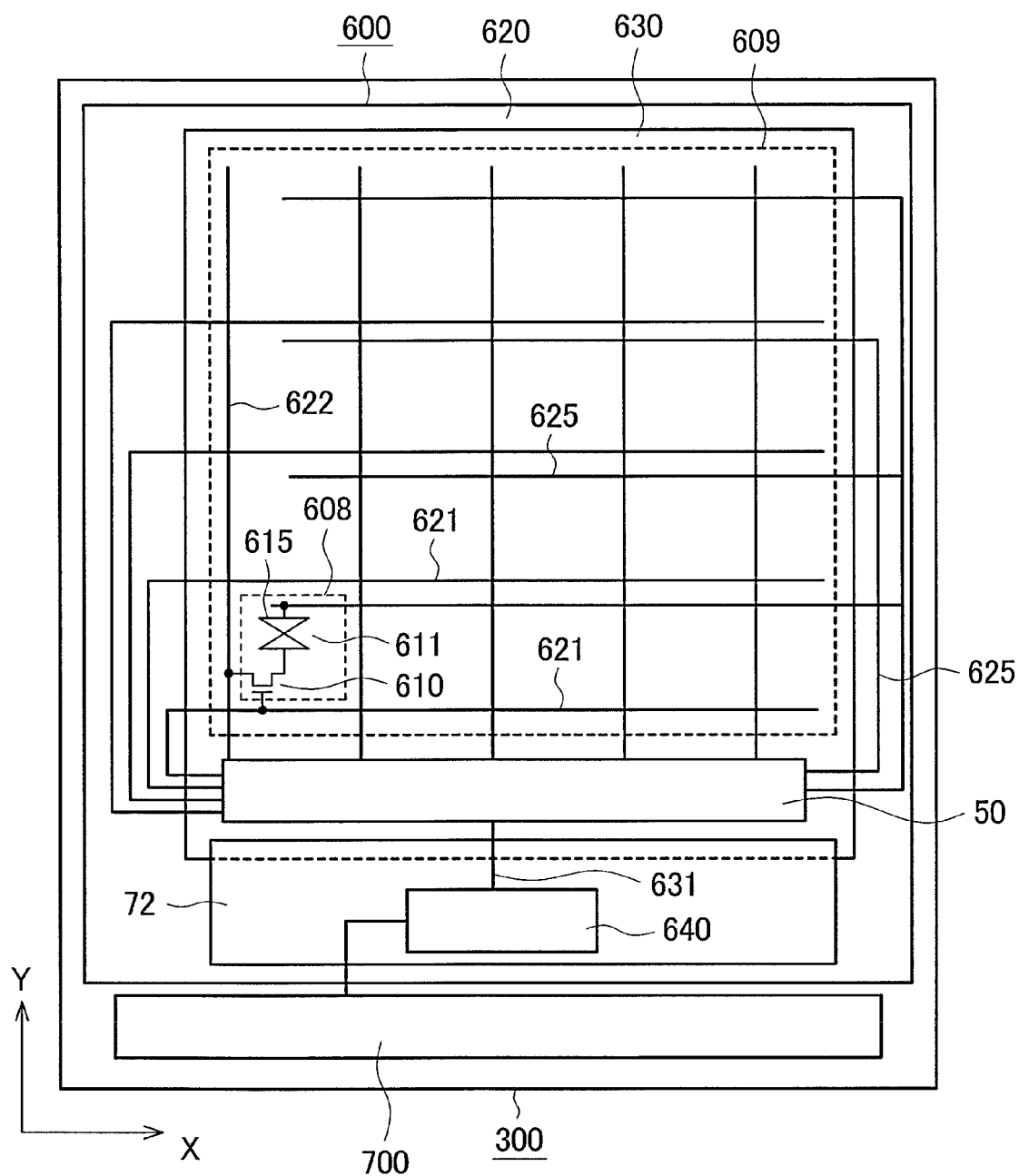
FIG. 3 is a schematic plan view of a liquid crystal display panel according to the embodiment of the present invention.

Next, the liquid crystal display panel 600 is explained in conjunction with FIG. 3. FIG. 3 is a block diagram showing the basic constitution of the display device 300. To facilitate the explanation of the display device 300, the touch panel 400 is omitted here. As described previously, the display device 300 is constituted of the liquid crystal display panel 600, the driver circuit 50, the flexible printed circuit board 72 and the backlight 700. The driver circuit 50 is mounted on one side of the liquid crystal display panel 600, and various kinds of signals are supplied to the liquid crystal display panel 600 from the driver circuit 50. A flexible printed circuit board 72 is electrically connected to the driver circuit 50 for supplying signals from the outside.

The liquid crystal display panel 600 is configured as follows. A substrate 620 (hereinafter, also referred to as a TFT substrate) on which a plurality of thin film transistors 610, a plurality of pixel electrodes 611, a counter electrode (common electrode) 615 and the like are formed, and a substrate 630 (hereinafter, also referred to as a filter substrate) on which a plurality of color filters and the like are formed overlap with each other with a predetermined gap therebetween. Both substrates are adhered to each other using a frame-shaped sealing material (not shown in the drawing) arranged between both substrates which overlap with each other and in the vicinity of peripheral portions of both substrates. Liquid crystal composition is filled in a space defined by both substrates and the sealing material. Further, a polarizer 601 is adhered to an outer surface of the filter substrate 630, and a polarizer 602 is adhered to an outer surface of the TFT substrate 620 (see FIG. 2). The flexible printed circuit board 72 is connected to the TFT substrate 620.

Here, this embodiment is applicable to both of a so-called lateral electric-field method type liquid crystal display panel in which the counter electrodes 615 are arranged on the TFT substrate 620 and a so-called vertical-electric-field method type liquid crystal display panel in which the counter electrodes 615 are arranged on the filter substrate 630 in the same manner.

As shown in FIG. 3, a plurality of scanning signal lines (also referred to as gate signal lines) 621 which extends in the x direction and is arranged parallel to each other in the y direction in the drawing and a plurality of video signal lines (also referred to as drain signal lines) 622 which extends in the y direction and is arranged parallel to each other in the x direction in the drawing are formed, and a pixel portion 608 is formed in each region which is surrounded by the scanning signal lines 621 and the video signal lines 622.

Here, although the liquid crystal display panel 600 includes a large number of pixel portions 608 in a matrix array, for facilitating the understanding of the drawing, only one pixel portion 608 is shown in FIG. 3. The pixel portions 608 arranged in a matrix array form a display region 609, the respective pixel portions 608 play a role of pixels of a display image, and an image is displayed in the display region 609.

The thin film transistor 610 of each pixel portion 608 has a source thereof connected to the pixel electrode 611, has a drain thereof connected to the video signal line 622, and has a gate thereof connected to the scanning signal line 621. The thin film transistor 610 functions as a switch for supplying a display voltage (grayscale voltage) to the pixel electrode 611.

Here, although naming of "source" and "drain" may be reversed based on the relationship of biases, in this embodiment, the terminal which is connected to the video signal line 622 is referred to as the drain electrode. The pixel electrode 611 and the counter electrode 615 form capacitance (liquid crystal capacitance) therebetween.

The driver circuit 50 is arranged on a transparent insulation substrate (glass substrate, resin substrate or the like) which constitutes the TFT substrate 620. The driver circuit 50 is connected to the scanning signal lines 621, the video signal lines 622 and counter electrode signal lines 625.

The flexible printed circuit board 72 is connected to the TFT substrate 620. The flexible printed circuit board 72 includes a connector 640. The connector 640 is connected to an external signal line so as to allow inputting of signals to the flexible printed circuit board 72 from the outside. A line 631 is provided between the connector 640 and the driver circuit 50, and the signals from the outside are inputted to the driver circuit 50.

The flexible printed circuit board 72 supplies a constant voltage to the backlight 700. The backlight 700 is used as a light source for the liquid crystal display panel 600. Here, although the backlight 700 is arranged on a back surface or a front surface of the liquid crystal display panel 600, to facilitate the understanding of the drawing, the backlight 700 is illustrated such that the backlight 700 is juxtaposed to the liquid crystal display panel 600 in FIG. 3.

A control signal transmitted from a control device (not shown in the drawing) arranged outside the display device 300 and a power source voltage supplied from an external power source circuit (not shown in the drawing) are inputted to the driver circuit 50 via the connector 640 and the line 631.

Signals inputted to the driver circuit 50 from the outside are control signals including a clock signal, a display timing signal, a horizontal synchronizing signal, a vertical synchronizing signal and the like, display-use data (R•G•B) and a display mode control command. The driver circuit 50 drives the liquid crystal display panel 600 in response to the inputted signals.

The driver circuit 50 is constituted of a one-chip semiconductor integrated circuit (LSI), and includes an output circuit for outputting scanning signals to the scanning signal lines 621, an output circuit for outputting video signals to the video signal lines 622, and an output circuit for outputting counter electrode voltages (common voltages) to the counter electrode signal lines 625. The driver circuit 50, based on a reference clock generated inside the driver circuit 50, sequentially supplies a selection voltage (scanning signal) of "High" level to the respective scanning signal lines 621 of the liquid crystal display panel 600 for every 1 horizontal scanning period. Due to such an operation, the plurality of thin film transistors 610 connected to each scanning signal line 621 of the liquid crystal display panel 600 allows the electrical conduction between the video signal lines 622 and the pixel electrodes 611 for 1 horizontal scanning period.

Further, the driver circuit 50 outputs a grayscale voltage corresponding to a grayscale to be displayed by the pixel to the video signal lines 622. When the thin film transistors 610 are brought into an ON (conductive) state, the grayscale voltage (video signal) is supplied to the pixel electrodes 611 from the video signal lines 622. Thereafter, when the thin film transistors 610 are brought into an OFF state, the grayscale voltage based on a video to be displayed by the pixels is held in the pixel electrodes 611.

A fixed counter electrode voltage is applied to the counter electrode 615. In the liquid crystal display panel 600, based on the potential difference between the pixel electrode 611 and the counter electrode 615, the alignment direction of the liquid crystal molecules sandwiched between the pixel electrode 611 and the counter electrode 615 is changed so that transmissivity or reflectance of light is changed whereby an image is displayed.

Further, in performing AC driving, the driver circuit 50 adopts a common inversion driving where a counter electrode voltage which reverses polarity thereof for every fixed period is outputted to the counter electrode signal line 625.

As described above, when a signal for driving the liquid crystal display panel 600 is changed, such a change is detected as noises in the touch panel 400. Here, it is necessary to cope with such noises. Particularly, the touch panel 400 has the property of prompting a user to input instructions or the like based on an image displayed on the liquid crystal display panel 600 so that it is necessary to mount the touch panel 400 on the display device such as the liquid crystal display panel 600 in an overlapping manner. Accordingly, the touch panel 400 is strongly influenced by noises generated by the display device on which the touch panel 400 is mounted in an adjacent and overlapping manner.

Figure 4:
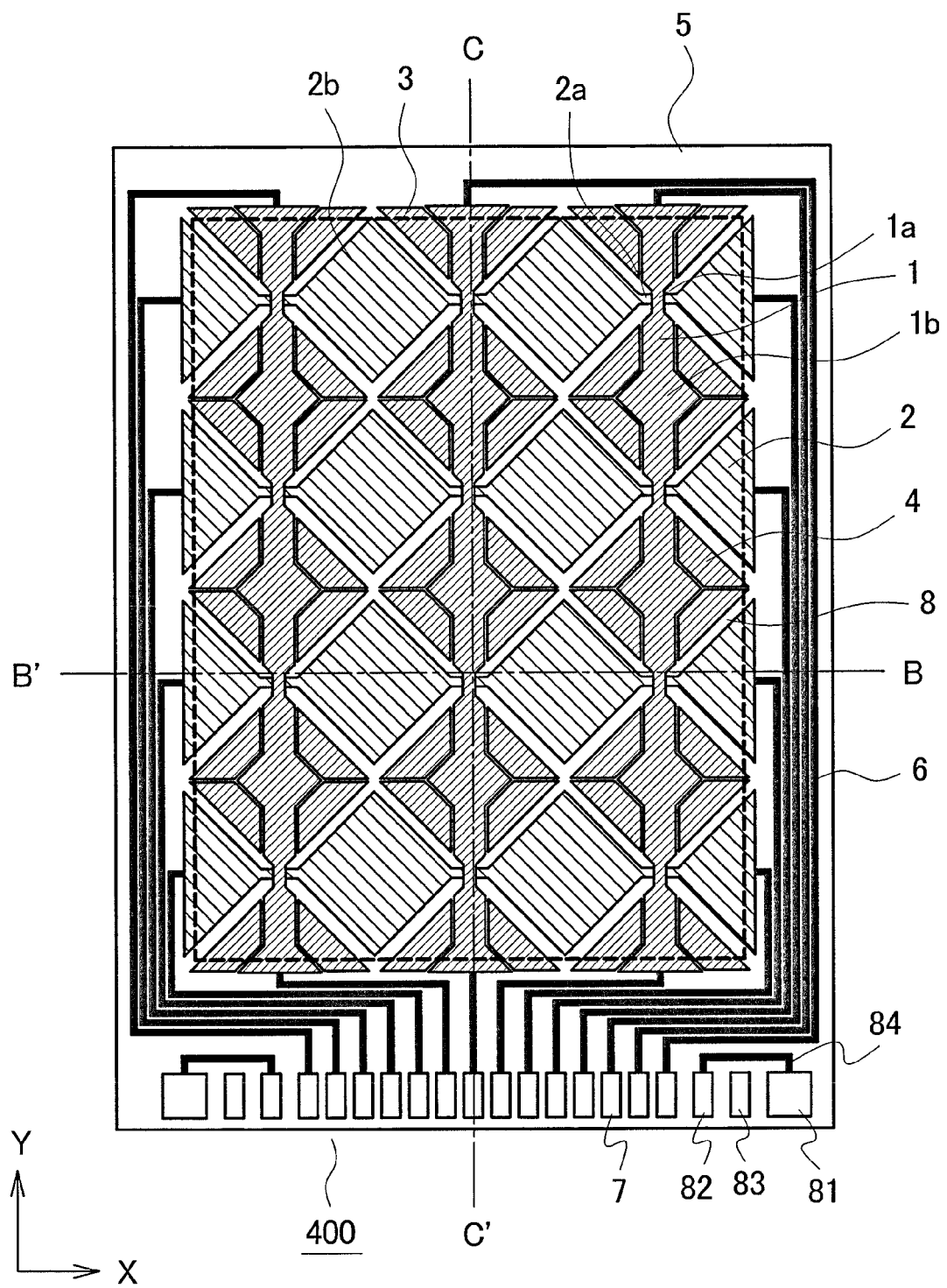
FIG. 4 is a schematic plan view of a touch panel according to the embodiment of the present invention.

Next, FIG. 4 is a schematic view of the touch panel 400. In this embodiment, the touch panel 400 is used in a longitudinally elongated manner. Here, an external shape of the touch panel which is used in an overlapping manner with the display panel has the substantially same shape as the display panel. The display panel has a rectangular shape in general, and either one of an X-directional side of the display panel and a Y-directional side of the display panel is generally longer than the other side. In FIG. 4, the liquid crystal display panel 600 which is used in an overlapping manner with the touch panel 400 also has a longitudinally elongated shape.

The touch panel 400 includes a glass substrate 5 which constitutes a transparent substrate. On one surface of the glass substrate 5 (also referred to as a front surface), touch-panel-use electrodes 1, 2, connection terminals 7, lines 6 which connect the touch-panel-use electrodes 1, 2 and the connection terminals 7 and a back-surface connection pad 81 are arranged. At least intersecting portions of two electrodes which are arranged to orthogonally intersect with each other are separated from each other by an insulation film.

The touch-panel-use electrodes 1, 2 are formed of a transparent conductive film. The electrodes which extend in the longitudinal direction (Y direction in the drawing) and are arranged parallel to each other in the lateral direction (X direction) are referred to as Y electrodes 1. The electrodes which extend in the lateral direction (X direction) so as to intersect with the Y electrodes 1 and are arranged parallel to each other in the longitudinal direction (Y direction) are referred to as X electrodes 2. The touch panel 400 detects changes of electrostatic capacitances of the Y electrodes 1 and the X electrodes 2, and calculates a position where the touch panel 400 is touched. A region surrounded by a dotted line 3 where the changes of electrostatic capacitances of the Y electrodes 1 and the X electrodes 2 can be detected is referred to as an input region.

Signals are supplied to the Y electrodes 1 and the X electrodes 2 formed on the touch panel 400 such that the signal is supplied to each electrode from both ends of each electrode thus enhancing the accuracy of detection of the signal. That is, in a case where charges are supplied to each Y electrode 1 and each X electrode 2 and a time which each electrode requires to reach a fixed voltage is measured so as to detect a change of capacitance, by supplying the charge from both ends of each electrode, it is possible to suppress an error in measurement which occurs due to line resistance.

Accordingly, lines 6 are formed on an outer periphery of the input region 3, and these lines 6 are connected to the connection terminals 7 which are formed parallel to each other on one side of the touch panel 400. The back-surface connection pads 81 are formed parallel to the connection terminals 7, and the back-surface connection pads 81 are electrically connected to the transparent conductive layer 603 which is formed on a back surface of the glass substrate 5 by way of conductive members 80 described later.

Parallel to the connection terminals 7, back-surface-use connection terminals 82 and dummy connection terminals 83 are arranged. An area of the back-surface connection pad 81 is set larger than an area of the connection terminal 7 thus facilitating a connection operation of the conductive member 80. Due to the provision of the dummy connection terminal 83, short-circuiting between the terminals can be prevented. Further, symbol 84 indicates lines which electrically connect the back-surface-use connection terminals 82 and the back-surface connection pads 81 and the lines can be formed by a step substantially equal to a step for forming other lines 6.

Next, each Y electrode 1 and each X electrode 2 are explained. Both of a width of each Y electrode 1 and a width of each X electrode 2 are made small at the intersecting portion 1a and the intersecting portion 2a where the Y electrode 1 and the X electrode 2 intersect with each other. Both of the width of the Y electrode 1 and the width of the X electrode 2 are made large at each electrode portion 1b which is sandwiched between two intersecting portions 1a and at each electrode portion 2b which is sandwiched between two intersecting portions 2a. Each electrode portion 1b sandwiched between the intersecting portions 1a is also referred to as an individual electrode, and each electrode portion 2b sandwiched between the intersecting portions 2a is also referred to as an individual electrode.

As shown in FIG. 4, a width of the individual electrode 1b of the Y electrode 1 in the touch panel 400 is decreased. That is, corresponding to a ratio between the number of the individual electrodes 1b of the Y electrode 1 and the number of the individual electrodes 2b of the X electrode 2, an area of the Y electrode 1 is decreased such that each Y electrode 1 is separated into the individual electrode 1b and electrodes having a floating potential (floating electrodes/dummy electrodes) 4.

Due to such a constitution, an area of the Y electrode 1 which is increased in accordance with the longitudinally elongated shape of the touch panel 400 can be decreased so that the capacitance of the Y electrodes 1 on one line becomes substantially equal to the capacitance of the X electrodes 2 on one line. Accordingly, noises generated from the liquid crystal display panel 600 due to a change of a signal voltage become substantially equal between the Y electrodes 1 and the X electrodes 2.

As described previously, on a back surface of the touch panel 400, the transparent conductive layer 603 is provided for suppressing influences of noises from the liquid crystal display panel 600. However, even when the transparent conductive layer 603 is provided, there may be a case where the influence of noises from the liquid crystal display panel 600 causes a problem more or less.

In the related art, although the individual electrode on each one line in the X direction and the individual electrode on each one line in the Y direction have the substantially same size, a length of the electrode on one line in the X direction and a length of the electrode on one line in the Y direction differ from each other and hence, the number of individual electrodes differs between the electrodes on one line in the X direction and the electrodes on one line in the Y direction. Accordingly, the capacitance on one line differs from each other between the X direction and the Y direction. Come to think of a touch panel having a longitudinally elongated shape as an example, the capacitance of Y electrodes corresponding to one line which are arranged parallel to each other in the Y direction becomes larger than the capacitance of X electrodes corresponding to one line which are arranged parallel to each other in the X direction.

Accordingly, in the touch panel of the related art where the capacitance of the electrode on one line differs between the X direction and the Y direction, noise intensity differs between the X direction and the Y direction. That is, in the touch panel of the related art, the S/N ratio differs between the X direction and the Y direction. Due to such difference in the S/N ratio, there exists a drawback that the detection sensitivity of the touch panel as a whole is defined by a lower S/N ratio.

This embodiment can overcome the above-mentioned drawback and can provide an input device which exhibits a large S/N ratio thus exhibiting good detection sensitivity. That is, by decreasing an area of the individual electrode 1b by division and by forming the floating electrodes 4, capacitance to ground can be decreased thus lowering a noise level.

In the electrodes shown in FIG. 4, when the floating electrode 4 is not arranged at the individual electrode 1b, a space 8 between the Y electrode 1 and the X electrode 2 which are arranged adjacent to each other becomes large. Although the Y electrode 1 and the X electrode 2 are formed of the transparent conductive film as described previously, an insulation film and the glass substrate are formed in the space 8 thus forming a region where there is no transparent conductive film. A portion where the transparent conductive film is provided and a portion where the transparent conductive film is not provided differ from each other with respect to transmissivity, reflectance and chromaticity of reflection light and hence, the space 8 can be observed by a user with naked eyes thus lowering quality of a display image.

According to our studies, a space appears dimly when a width of the space 8 is 30 μm, and the space substantially completely disappears when the width of the space 8 is 20 μm. Further, when the width of the space 8 is 10 μm, the space completely disappears. The narrower the space 8, the more capacitance between the Y electrode 1 and the X electrode 2 arranged adjacent to each other by way of the floating electrode 4 becomes. Further, narrowing of the space 8 increases the number of defects in which the floating electrode 4 is short-circuited with the Y electrode 1 or the X electrode 2 due to abnormality in pattern forming attributed to adhesion of a foreign material or the like in steps.

When the individual electrode 1*b* of the Y electrode 1 and the floating electrode 4 arranged adjacent to the individual electrode 1*b* are short-circuited, capacitance to ground of the corresponding Y electrodes on one line is increased so that noises are increased thus giving rise to a drawback that detection sensitivity is lowered. To decrease the capacitance which is increased when such short-circuiting occurs, the floating electrode 4 is divided in four as shown in FIG. 4. Although the possibility of occurrence of short-circuiting failure is lowered when the floating electrode 4 is further divided, the number of regions where there is no transparent conductive film is increased in the region corresponding to the floating electrode 4 and hence, there exists a possibility that the difference in transmissivity, reflectance and chromaticity occurs and is increased between one electrode and the neighboring electrode. Accordingly, as described above, the floating electrode 4 is divided in four such that the space between the electrodes is set to a value smaller than approximately 30 μm, and more preferably to approximately 20 μm.

In this embodiment, the explanation has been made with respect to the case in which the touch panel is used in an overlapping manner with the longitudinally-elongated liquid crystal display panel 600. However, even when the touch panel is used in an overlapping manner with a laterally-elongated liquid crystal display device or an image display device of other type, the present invention can acquire the same advantageous effects. Further, the number of division of the floating electrode is not limited to four.

Figure 5:
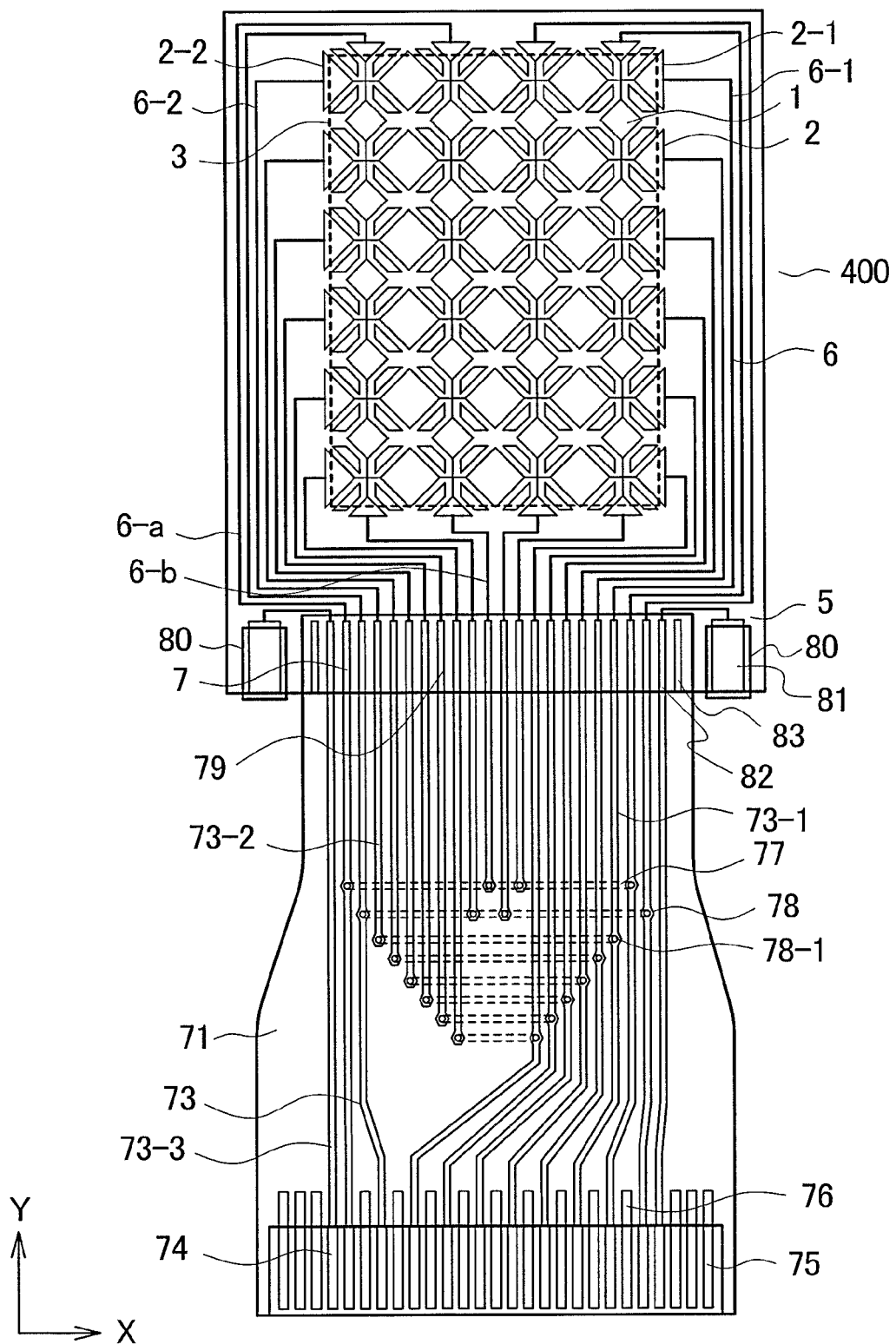
FIG. 5 is a schematic plan view showing a state in which a flexible printed circuit board is mounted on the touch panel according to the embodiment of the present invention.

Next, FIG. 5 shows the structure in which the flexible printed circuit board 71 is adhered to the touch panel 400 using an anisotropic conductive film or the like. The flexible printed circuit board 71 is electrically connected to the connection terminals 7 of the touch panel 400, and supplies various signals outputted from a control circuit (not shown in the drawing) to the touch panels 400.

First of all, signals outputted from the control circuit are transmitted to lines 73 which are formed on the flexible printed circuit board 71 via external-device-side input/output terminals 74. Through holes 78 are formed in the lines 73 so as to allow the lines 73 to be connected to intersecting lines 77 which are formed on a back surface of the flexible printed circuit board 71.

The intersecting lines 77 intersect with a large number of lines 73, and are again connected to the lines 73 via the through holes 78 formed in another ends thereof. The intersecting lines 77 and the lines 73 orthogonally intersect with each other such that an overlapping area becomes as small as possible. That is, the intersecting lines 77 are formed along the X direction, and the lines 73 are formed along the Y direction at the intersecting portions. Further, intersecting lines 77 are formed not to intersect with power source lines 73-3 having a ground potential.

Here, for a shielding purpose, the power source lines 73-3 supply a ground potential (GND) to the transparent conductive layer 603 formed on the back surface of the touch panel 400. The lines 73-3 and the back-surface-use connection terminals 82 are electrically connected to each other via the lines 84, the back surface connection pads 81, and the front-to-back connection conductive member 80. Further, the lines 73-3 are formed so as to surround other lines 73 and hence, the lines 73-3 have an advantageous effect of shielding other lines 73.

Signals are supplied to the Y electrodes 1 and the X electrodes 2 formed on the touch panel 400 from both ends of each electrode thus enhancing detection accuracy of the signals. That is, in a case where charges are supplied to each Y electrode 1 and each X electrode 2, and times which these electrodes 1, 2 require to reach fixed voltages respectively are measured so as to detect capacitance changes, by supplying the charge to each electrode from both ends of the electrode, it is possible to suppress errors in measurement attributed to line resistances.

Accordingly, as in the case of X electrodes 2-1 and 2-2 shown in FIG. 5, a line 6-1 is connected to the X electrode 2-1 from a right side in the drawing, and a line 6-2 is connected to the X electrode 2-2 from a left side in the drawing. In the same manner, the Y electrode 1 also has both upper and lower ends thereof connected to peripheral lines 6.

Touch-panel-side input/output terminals 79 are formed on the flexible printed circuit board 71, and these input/output terminals 79 are connected to the connection terminals 7 formed on a front surface of the touch panel 400. The connection terminals 7 are connected to the lines 6, and the lines 6 are formed on an outer periphery of the input region 3 so as to supply signals to the Y electrodes 1 and the X electrodes 2 from both ends of each electrode.

To supply signals to the Y electrodes 1 and the X electrodes 2 from both ends of each electrode in this manner, it is necessary to branch a signal outputted from the control circuit so as to supply signals to two end portions. In the flexible printed circuit board 71, by supplying the signal outputted from the control circuit to the lines 73-1, 73-2 in a branching manner, it is possible to supply signals to the Y electrode 1 and the X electrode 2 from both ends of each electrode.

Further, since the branched lines intersect with other lines, the intersecting lines 77 are formed on the back surface of the flexible printed circuit board 71, and the intersecting lines 77 are connected to the lines 73 via the through holes 78. That is, the through holes 78 plays a role of connecting the lines 73 to the intersecting lines 77 arranged on the back surface of the flexible printed circuit board 71 and a role of branching the signals. Since the signals are branched on the flexible printed circuit board 71, the number of lines through which signals are supplied on a touch panel 400 side is increased compared to the number of lines through which signals are supplied on an external-device-side input/output terminal 74 side. Accordingly, dummy terminals 76 are formed between the external-device-side input/output terminals 74. Further, dummy terminals 75 are formed also outside the external-device-side input/output terminal 74 so as to enhance the connection reliability.

Due to the constitution in which signals are supplied from both ends of each Y electrode 1 and each X electrode 2, there arises a peculiar drawback that the lines intersect with each other. Particularly, when the connection terminals 7 are formed on a short side of the touch panel 400, the Y electrodes 1 which extend in the longitudinal direction (in the Y direction in the drawing) and are arranged parallel to each other in the lateral direction (in the X direction) are connected to lines 6-*b* arranged in the vicinity of the center of the touch panel 400 and lines 6-*a* arranged in the vicinity of outer edges of the touch panel 400.

Accordingly, on the flexible printed circuit board 71, the intersecting lines 77 which connect the lines 6-*b* and the lines 6-*a* intersect with many other lines 73. Accordingly, the line capacitance of the Y electrode 1 becomes larger than the line capacitance of the X electrode 2. As mentioned previously, the Y electrodes 1 also have the drawback that the area of the Y electrode 1 is increased in accordance with the longitudinally elongated shape of the touch panel 400 and hence, the Y electrodes 1 are liable to be more easily influenced by noises than the X electrodes 2. Accordingly, when the connection terminals 7 are formed on the short side of the touch panel 400, it is effective to adopt the constitution in which the area of the Y electrode 1 is decreased so as to set the capacitance of Y electrodes 1 on one line substantially equal to the capacitance of the X electrodes 2 on one line thus making an amount of noises generated by fluctuation of a signal voltage generated from the liquid crystal display panel 600 substantially equal between the Y electrodes 1 and the X electrodes 2.

Further, as a countermeasure to eliminate or reduce noises, a transparent conductive layer 603 is formed on a back surface of the glass substrate 5. A voltage such as a ground potential supplied to the transparent conductive layer 603 via the flexible printed circuit board 71 is supplied to the back-surface connection pads 81 via the back-surface-use connection terminals 82 and the lines 84.

Figure 6A:
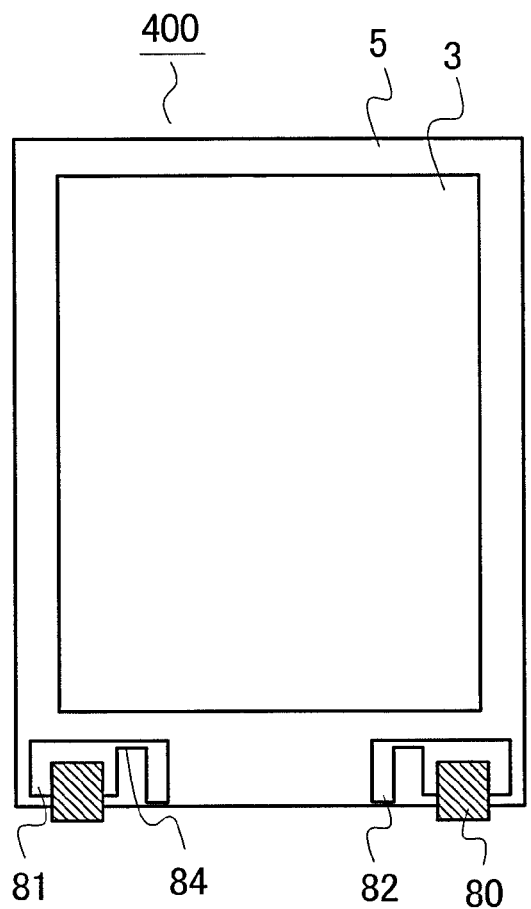
FIG. 6A is a schematic plan view of the touch panel according to the embodiment of the present invention.
Figure 6B:
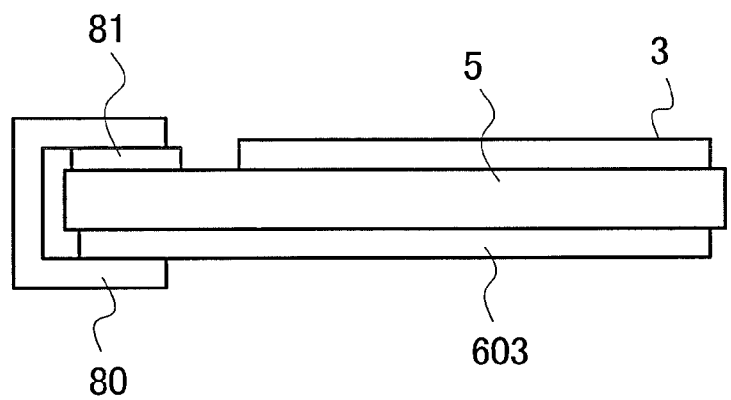
FIG. 6B is a schematic side view of the touch panel according to the embodiment of the present invention.

FIG. 6A and FIG. 6B show a state where the transparent conductive layer 603 and the back-surface connection pads 81 are connected to each other. FIG. 6A is a schematic plan view of the touch panel 400 and FIG. 6B is a schematic side view of the touch panel 400. In FIG. 6A and FIG. 6B, the touch panel 400 is described in a simplified manner for facilitating the explanation of the connection between the transparent conductive layer 603 and the back-surface connection pads 81. The input region 3 is formed on the front surface of the glass substrate 5 which constitutes the touch panel 400. The back-surface-use connection terminals 82 are formed on the front surface of the glass substrate 5 which constitutes the touch panel 400, and the back-surface-use connection terminals 82 are connected to the flexible printed circuit board 71 not shown in the drawing. The back-surface-use connection terminals 82 and the back-surface connection pads 81 are connected to each other via lines 84. Here, the lines 84 are integrally formed with the back-surface-use connection terminals 82 and the back-surface connection pads 81.

The back-surface connection pads 81 and the transparent conductive layer 603 are connected to each other via a conductive tape which constitutes the conductive members 80 (hereinafter the conductive tape being also indicated by numeral 80). The conductive tape 80 is a line which is formed by applying a copper foil to a resin-made base material, and an anisotropic conductive film containing conductive beads having a particle size of 4 μm is adhered to one surface of the copper foil. The conductive tape 80 has one end thereof adhered to the back-surface connection pads 81 and the other end thereof adhered to the transparent conductive layer 603. After such adhesion, the conductive tape 80 is bonded to the back-surface connection pads 81 and the transparent conductive layer 603 by thermal compression bonding using tweezers type soldering iron or the like. In FIG. 6, the conductive tape 80 is provided at two portions, that is, at left and right portions of a side of the touch panel 400 on which the connection terminals 7 are mounted.

By using the conductive tape 80 cheaper than the flexible printed circuit board and by adhering the conductive tape 80 by thermal compression bonding using the tweezers type soldering iron or the like which is an ordinary tool, it is possible to reduce a manufacturing cost. Further, in an operation using the tweezers type soldering iron, it is unnecessary to turn over the touch panel 400 to adhere the conductive tape 80 to the back surface of the touch panel 400 thus obviating a possibility that a surface of an electrode formed on the touch panel 400 is injured or stained.

Figure 7:
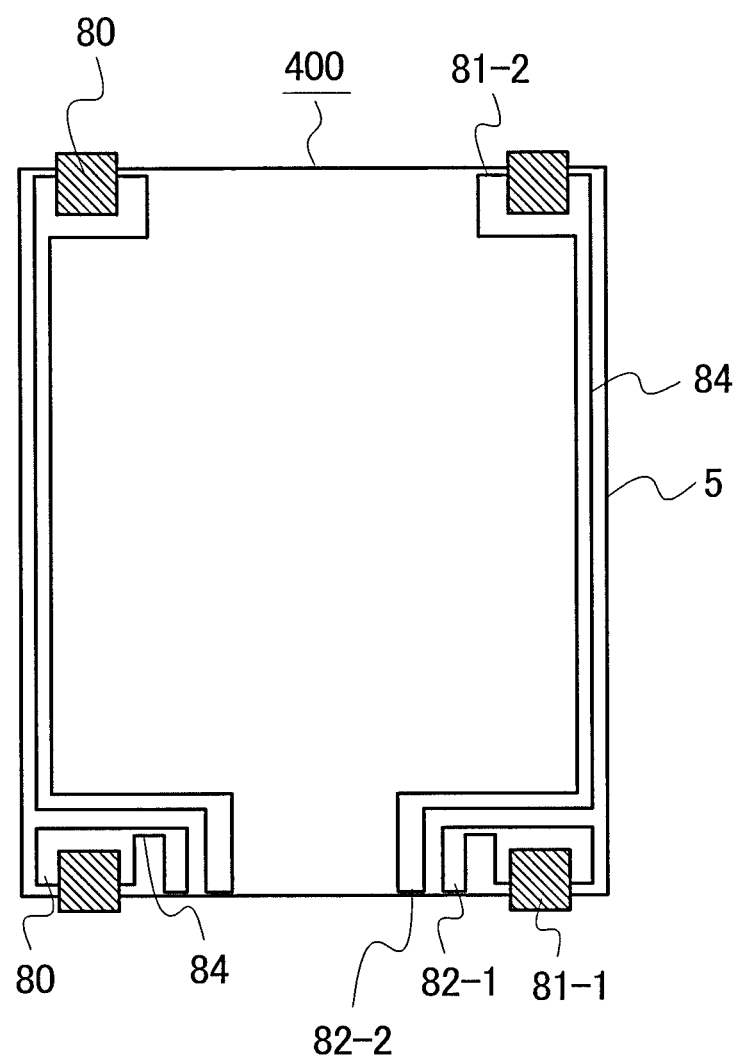
FIG. 7 is a schematic plan view of a touch panel of a modification of the embodiment of the present invention.

As shown in FIG. 7, back-surface connection pads 81-2 are also formed on a side of the touch panel 400 opposite to a side of the touch panel 400 on which the connection terminals 7 are mounted. The back-surface connection pads 81-2 are connected to the conductive tapes 80 via the line patterns 84 formed on the glass substrate 5. The transparent conductive film has specific resistance higher than specific resistance of ordinary metal. Accordingly, in FIG. 7, by forming the back-surface connection pads 81 at four corner portions of the substrate or by additionally forming the back-surface connection pads 81 on a side of the touch panel 400 opposite to a side of the touch panel 400 on which the connection terminals 7 are mounted, it is possible to make the potential of the transparent conductive layer 603 at the back surface uniform.

In FIG. 7, the back-surface-use connection terminals 82-1 for the front/rear connection pads 81-1 at the corner portions of the side of the touch panel 400 where the connection terminals 7 are formed and the back-surface-use connection terminals 82-2 for the front/rear connection pads 81-2 at the corner portions of the side opposite to the terminal side are described in a separately arranged manner. However, even when the back-surface-use connection terminal 82-1 and the back-surface-use connection terminal 82-2 may be connected to each other by the line pattern 84 on the glass substrate 5, such arrangement can also acquire the substantially equal advantageous effect. The line pattern 84 may be formed of a multi-layered film consisting of a transparent conductive film and a metal layer. Due to such structure, a line resistance of the line pattern 84 becomes lower than a line resistance of a line pattern formed of a single-layered transparent conductive film.

Figure 8:
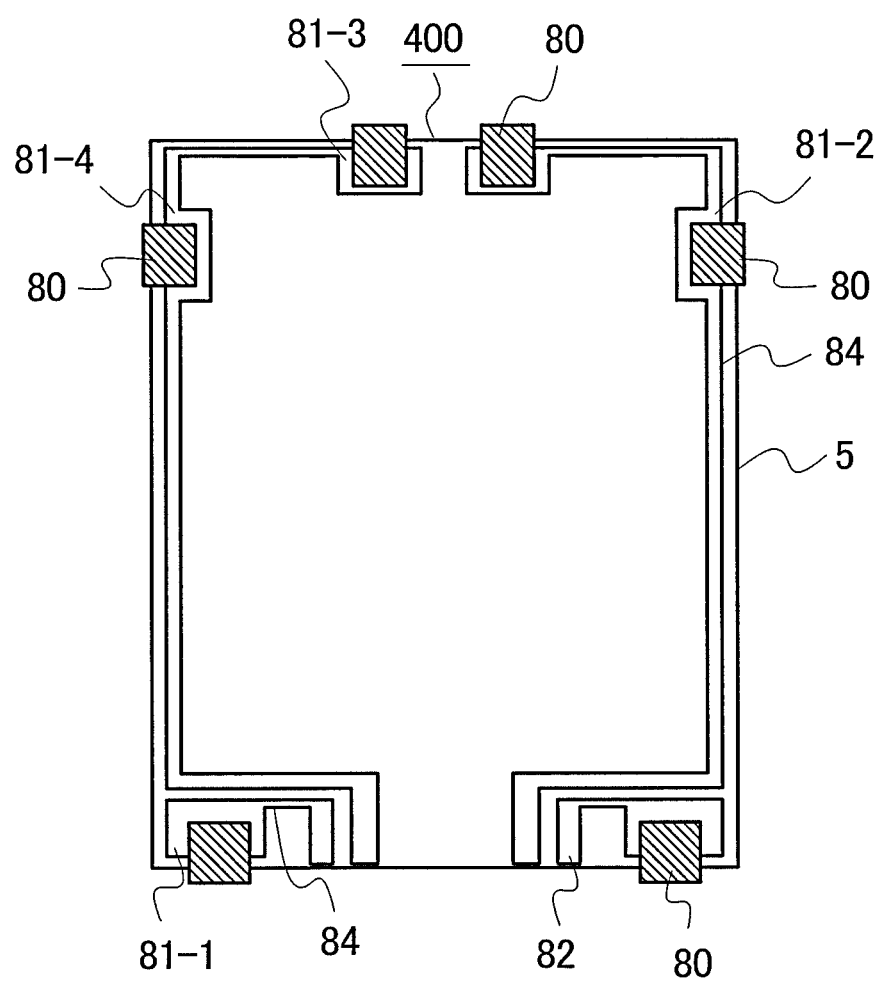
FIG. 8 is a schematic plan view of a touch panel of a modification of the embodiment of the present invention.

Next, FIG. 8 shows a case where the back-surface connection pad 81 is formed on four sides of the touch panel 400 so as to make the potential of the transparent conductive layer 603 formed on the back surface of the touch panel 400 more uniform.

Figure 9:
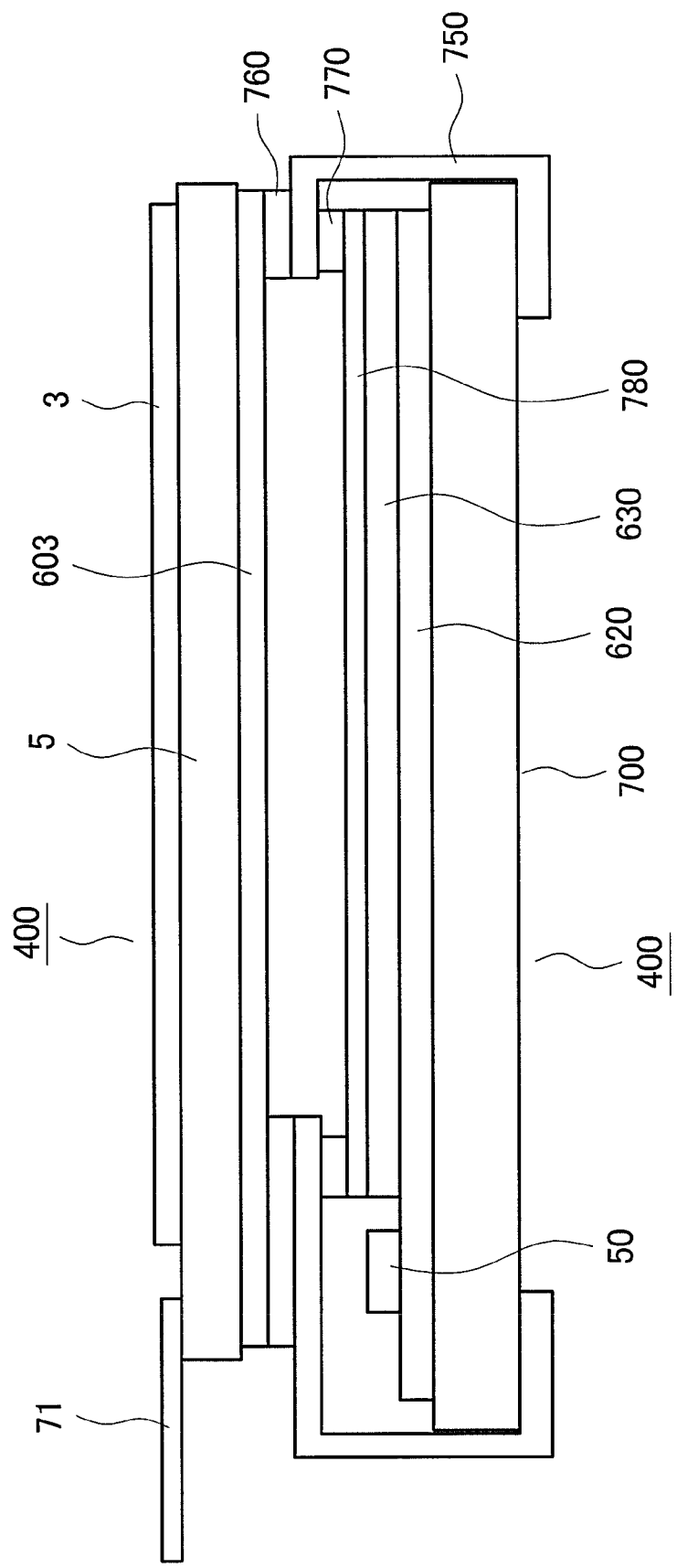
FIG. 9 is a schematic cross-sectional view of a display device of a modification of the embodiment of the present invention.

Next, FIG. 9 shows a state where the touch panel 400 is arranged on a display device in a stacked manner using a metal frame 750. The transparent conductive layer 603 which is formed on a back surface of the touch panel 400 and the metal frame are connected to each other by an anisotropic conductive tape 760 made of a conductive resin or containing conductive beads. A voltage signal is applied to the transparent conductive layer 603 formed on the back surface of the touch panel 400 via the metal frame 750 of the display device. Due to such a constitution, it is possible to apply a voltage to the transparent conductive layer 603 without using a pattern or a member which is exclusively used for connecting the front surface and the back surface of the touch panel. Here, the substantially equal advantageous effects can be acquired by connecting the transparent conductive layer 603 to a connection pad arranged on a substrate of the display device or to a pattern arranged on a display-device-side flexible printed circuit board using a conductive resin or the like in place of the metal frame 750.

Numeral 780 indicates a transparent conductive layer which is formed on a liquid-crystal-display-panel side. The transparent conductive layer 780 is connected to the metal frame 750 by a conductive resin 770 or the like. The transparent conductive layer 603 is formed on the back surface of the touch panel 400, and the transparent conductive layer 780 is formed on the liquid-crystal-display-panel side thus enhancing the shielding effect.

Next, a manufacturing method of the touch panel according to the present invention is explained in conjunction with FIG. 10A to FIG. 14B. FIG. 10A, FIG. 11A, FIG. 12A, FIG. 13A and FIG. 14A are respectively schematic cross-sectional views taken along a line B-B' in FIG. 4 showing respective steps of the manufacturing method. In the same manner, FIG.

10B, FIG. 11B, FIG. 12B, FIG. 13B and FIG. 14B are respectively schematic cross-sectional views taken along a line C-C' in FIG. 4 showing respective steps of the manufacturing method.

Figure 10A:
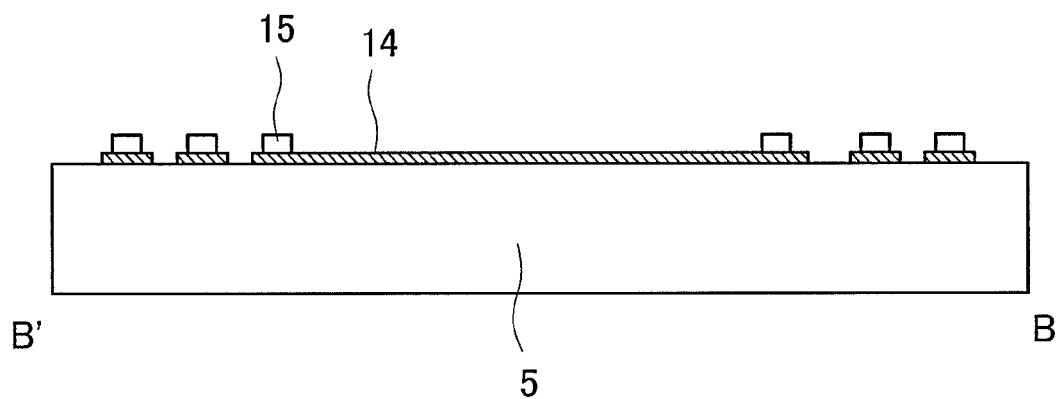
FIG. 10A and FIG. 10B are schematic cross-sectional views showing a first step for forming the touch panel according to the embodiment of the present invention.
Figure 10B:
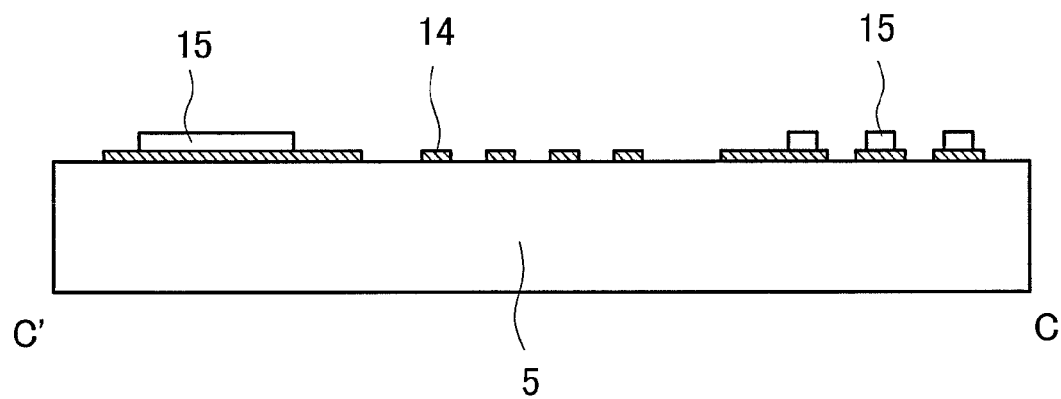

First of all, a first step is explained in conjunction with FIG. 10A and FIG. 10B. In the step shown in FIG. 10A and FIG. 10B, a first ITO film 14 (Indium Tin Oxide) having a film thickness of approximately 15 nm is formed on a glass substrate 5 and, thereafter, a silver alloy film 15 having a film thickness of approximately 200 nm is formed on the ITO film 14. A resist pattern is formed in a photolithography step, and the silver alloy film 15 is patterned. Next, the resist is peeled off and removed, a resist pattern is formed in a photolithography step, and the first ITO film 14 is patterned. Then, the resist is peeled off and removed thus forming the patterned ITO film 14 and the silver alloy film 15 as shown in FIG. 10A and FIG. 10B. Since the silver alloy film 15 is non-transparent, to avoid the observation of the silver alloy film 15, the silver alloy film 15 is removed from a portion where the silver alloy film 15 covers a display region of the liquid crystal display panel 600 which is overlapped to the glass substrate 5 later so that the silver alloy film 15 is formed only on the peripheral lines 6.

Figure 11A:
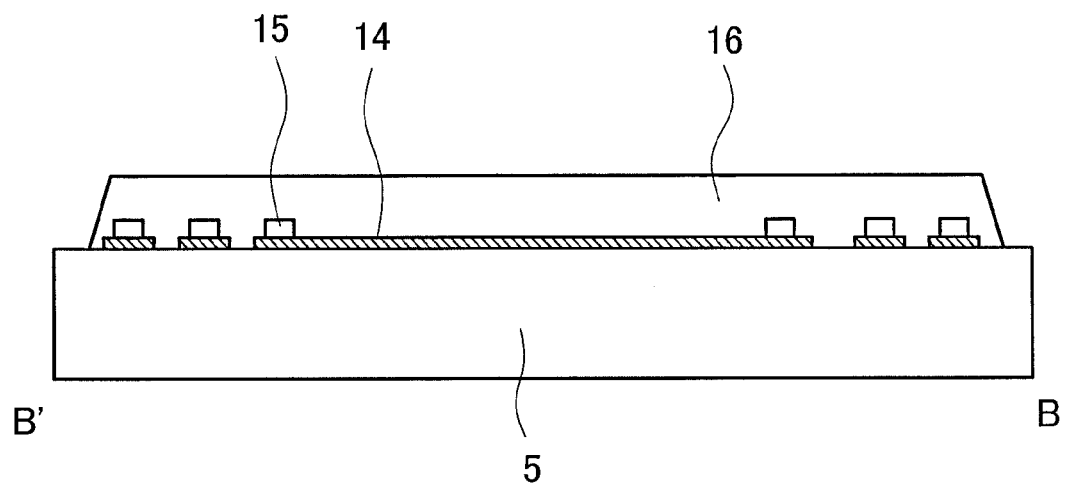
FIG. 11A and FIG. 11B are schematic cross-sectional views showing a second step for forming the touch panel according to the embodiment of the present invention.
Figure 11B:
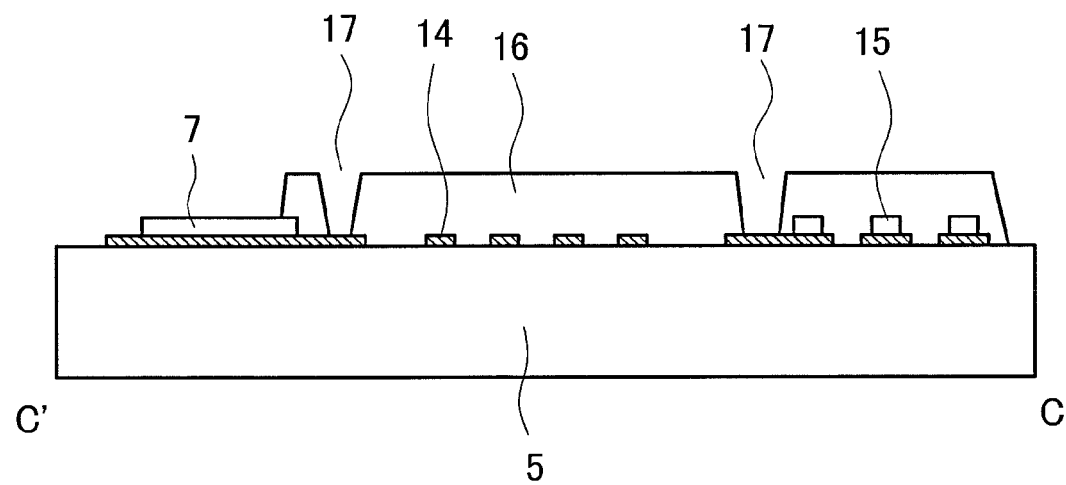

Next, the second step is explained in conjunction with FIG. 11A and FIG. 11B. To the glass substrate 5 on which the first ITO film 14 and the silver alloy film 15 are patterned, a photosensitive interlayer insulation film 16 is applied by coating, and the interlayer insulation film 16 is patterned using a photolithography technique. It is desirable that the interlayer insulation film 16 is a film containing $SiO_2$ as a main component and having a film thickness of 1 μm or more. As shown in FIG. 11B, contact holes 17 are formed in a peripheral portion of the interlayer insulation film 16. Further, the interlayer insulation film 16 is removed at a connection portion 7 which is used for connection with an external driver circuit.

Figure 12A:
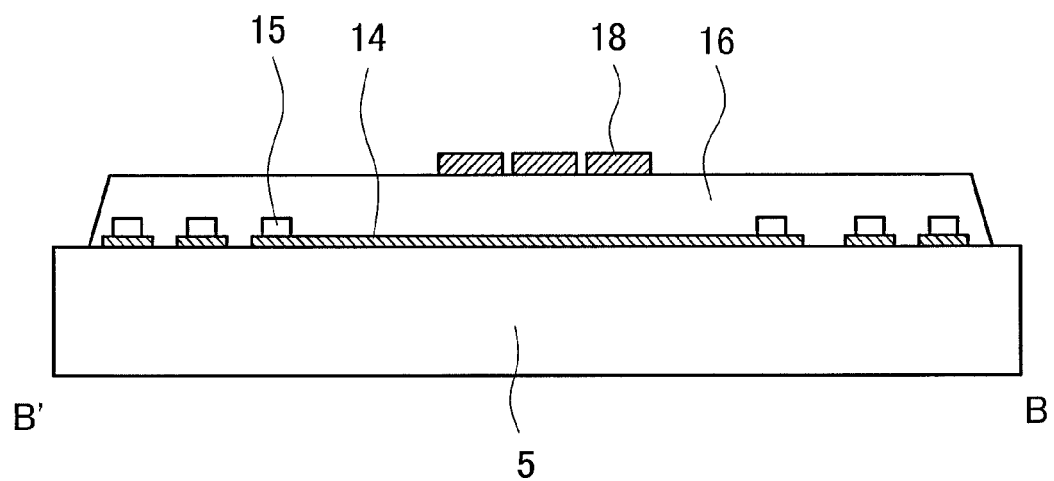
FIG. 12A and FIG. 12B are schematic cross-sectional views showing a third step for forming the touch panel according to the embodiment of the present invention.
Figure 12B:
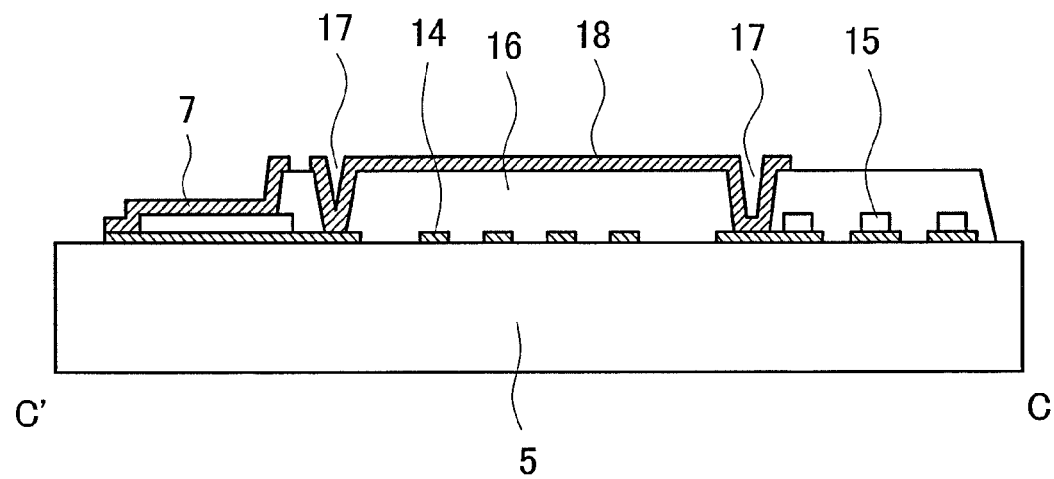

Next, the third step is explained in conjunction with FIG. 12A and FIG. 12B. A second ITO film 18 having a film thickness of approximately 30 nm is formed, a resist pattern is formed in a photolithography step, and the second ITO film 18 is patterned. Then, the resist is peeled off and removed thus forming the second ITO film 18 as shown in FIG. 12A and FIG. 12B.

Figure 13A:
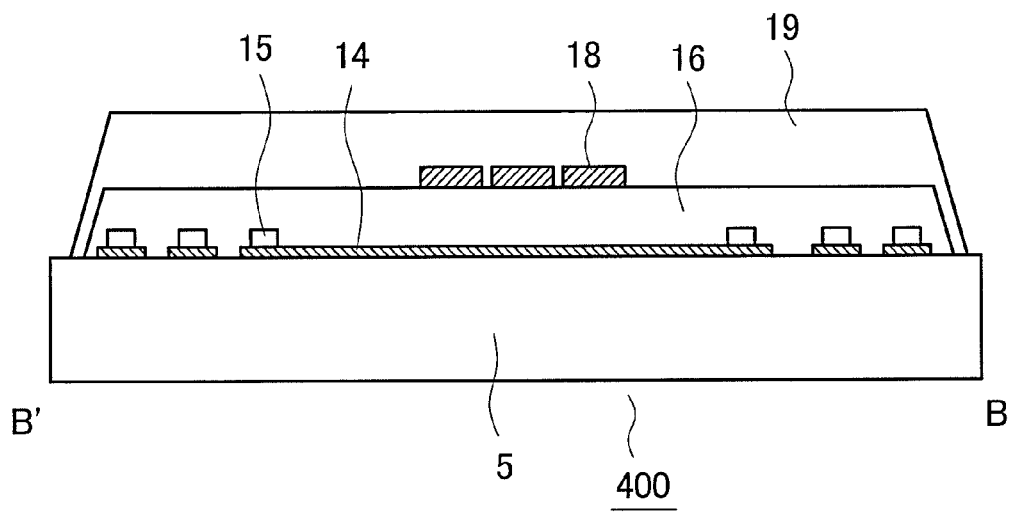
FIG. 13A and FIG. 13B are schematic cross-sectional views showing a fourth step for forming the touch panel according to the embodiment of the present invention.
Figure 13B:
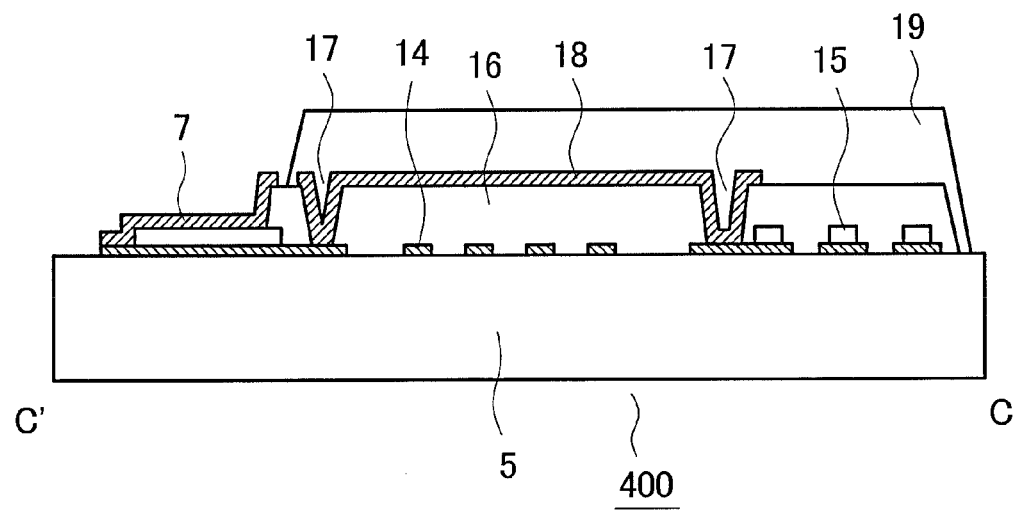

Next, the fourth step is explained in conjunction with FIG. 13A and FIG. 13B. A film equal to the insulation film used in the second step is applied to the glass substrate 5 again as an uppermost protective film 19. The uppermost protective film 19 is patterned by photolithography.

Figure 14A:
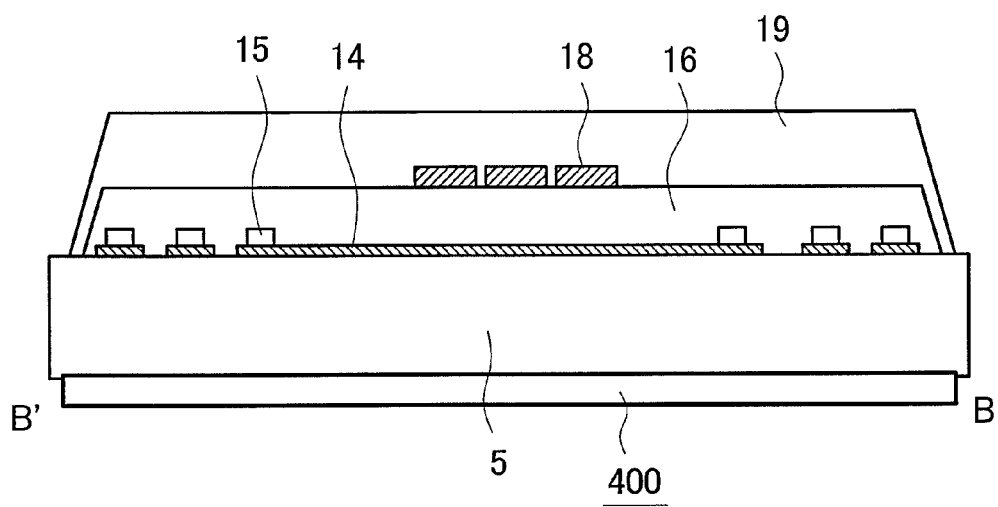
FIG. 14A and FIG. 14B are schematic cross-sectional views showing a fifth step for forming the touch panel according to the embodiment of the present invention.
Figure 14B:
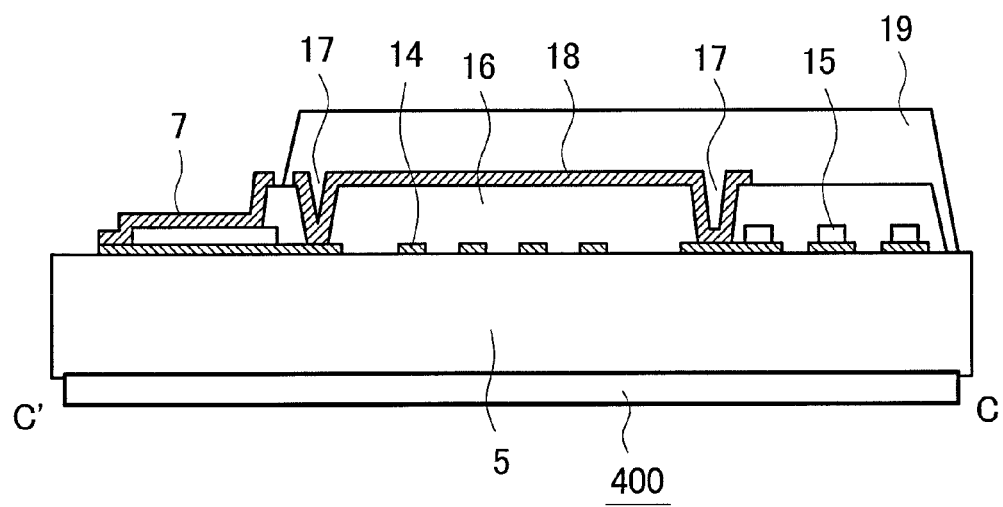

Next, the fifth step is explained in conjunction with FIG. 14A and FIG. 14B. In the fifth step, an ITO film is formed on a back surface of the glass substrate 5 as the transparent conductive layer 603. At the time of forming the transparent conductive layer 603, a mask is formed on a peripheral portion of a front surface of the glass substrate 5. This is because when the ITO film is formed on the back surface of the glass substrate 5, there exists a possibility that ITO routes around an edge of the glass substrate 5 and is adhered to a front surface side. Accordingly, it is necessary to protect the peripheral portion of the front surface of the glass substrate 5 using the mask. The touch panel 400 is formed through the above-mentioned steps.

As has been explained above, according to the embodiment of the present invention, in the electrostatic-capacitance-type inputting device for the display device which displays image information or character information, it is possible to manufacture a touch panel which exhibits excellent detection sensitivity. According to the present invention, the input detection region is not limited to any particular shape, and the shape of the individual electrode is also not limited to any particular shape. Further, in the above-mentioned embodiment, the explanation is made with respect to electrodes extending in the X direction and the electrodes extending in the Y direction which orthogonally intersect with each other. However, so long as these electrodes are provided for enhancing an S/N ratio between electrode lines for detecting an input position, the present invention is also effectively applicable to capacitances between electrodes which intersect with each other obliquely or capacitances between electrodes which differ from each other in length and extend parallel to each other.

Although the invention made by inventors of the present invention has been specifically explained in conjunction with the embodiment heretofore, it is needless to say that the present invention is not limited to the above-mentioned embodiment and various modifications are conceivable without departing from the gist of the present invention.

What is claimed is:

1. An electrostatic-capacitance touch panel comprising:
a plurality of X electrodes which are formed above a front surface of the electrostatic-capacitance touch panel;
a plurality of Y electrodes which intersect with the X electrodes;
a back-surface electrode which is formed above a back surface of the electrostatic-capacitance touch panel;
X-electrode signal lines which supply signals to the X electrodes from both ends of each X electrode;
Y-electrode signal lines which supply signals to the Y electrodes from both ends of each Y electrode;
a flexible printed circuit board connected to the X-electrode signal lines and the Y-electrode signal lines at a connection portion;
intersecting portions where the X electrodes and the Y electrodes overlap with each other; and
electrode portions each of which is formed between two intersecting portions;
wherein a back-surface-connection-use terminal is formed outside of the connection portion; and
wherein the back-surface-connection-use terminal and the back-surface electrode are connected to each other using a conductive member.

2. An electrostatic-capacitance touch panel according to claim 1, wherein the conductive member which is connected to the back-surface electrode of the electrostatic-capacitance touch panel is formed of a conductive tape.

3. An electrostatic-capacitance touch panel according to claim 1, wherein the conductive member and the back-surface-connection-use terminal are connected to each other using an anisotropic conductive film.

4. An electrostatic-capacitance touch panel according to claim 1, wherein the back-surface electrode is formed of a transparent conductive film.

5. An electrostatic-capacitance touch panel according to claim 1, wherein an area of an electrode portion of the Y electrode is smaller than an area of an electrode portion of the X electrode, and a dummy electrode is arranged close to the electrode portion of the X electrode or the Y electrode.

6. An electrostatic-capacitance touch panel according to claim 1, wherein the back-surface-connection-use terminal is formed adjacent to the connection portion.

7. An electrostatic-capacitance touch panel comprising:
a plurality of X electrodes which are formed above a front surface of the electrostatic-capacitance touch panel;
a plurality of Y electrodes which intersect with the X electrodes;

a back-surface electrode which is formed above a back surface of the electrostatic-capacitance touch panel;
a flexible printed circuit board which is electrically connected to the X electrodes and the Y electrodes;
connection terminals which are formed above a short side of a front surface of the electrostatic-capacitance touch panel and connect the X electrodes and the Y electrodes to the flexible printed circuit board;
intersecting portions where the X electrodes and the Y electrodes overlap with each other; and
individual electrodes each of which is formed between two intersecting portions and has a width larger than a width of the intersecting portion;
wherein the Y electrodes are formed along the long side of the display panel;
wherein the X electrodes are formed along the short side of the display panel;
wherein a back-surface-connection-use terminal is formed above a short side of the front surface of the electrostatic-capacitance touch panel and adjacent to the connection terminals; and
wherein the back-surface-connection-use terminal and the back-surface electrode are connected to each other using a conductive member.

8. An electrostatic-capacitance touch panel according to claim 7, wherein the conductive member which is connected to the back-surface electrode of the electrostatic-capacitance touch panel is formed of a conductive tape.

9. An electrostatic-capacitance touch panel according to claim 7, wherein the conductive member and the back-surface-connection-use terminal are connected to each other using an anisotropic conductive film.

10. An electrostatic-capacitance touch panel according to claim 7, wherein the back-surface electrode is formed of a transparent conductive film.

11. An electrostatic-capacitance touch panel according to claim 7, wherein an area of the individual electrode of the Y electrode is smaller than an area of the individual electrode of the X electrode, and a dummy electrode is arranged close to the individual electrode of the X electrode or the individual electrode of the Y electrode.

12. An electrostatic-capacitance touch panel comprising:
a plurality of X electrodes which are formed above a front surface of the electrostatic-capacitance touch panel;
a plurality of Y electrodes which intersect with the X electrodes;
a back-surface electrode which is formed above a back surface of the electrostatic-capacitance touch panel;
first lines which supply signals to the X electrodes;
second lines which supply signals to the Y electrodes;
a flexible printed circuit board on which the first lines and the second lines are formed;
intersecting portions where the X electrodes and the Y electrodes overlap with each other; and
individual electrodes each of which is formed between two intersecting portions and has a width larger than a width of the intersecting portion;
wherein the flexible printed circuit board includes an external-device-side input/output terminal and an electrostatic capacitance touch-panel-side input/output terminal;
a back-surface-use connection terminal is provided in parallel to the electrostatic capacitance touch-panel-side input/output terminal;
wherein a constant-voltage power source is supplied to the back-surface-use connection terminal via the flexible printed circuit board; and
wherein the back-surface electrode and the back-surface-use connection terminal are connected to each other using a conductive member.

13. An electrostatic-capacitance touch panel according to claim 12, wherein the conductive member which is connected to the back-surface electrode of the electrostatic-capacitance touch panel is formed of a conductive tape.

14. An electrostatic-capacitance touch panel according to claim 12, wherein the conductive member and the back-surface-connection-use terminal are connected to each other using an anisotropic conductive film.

15. An electrostatic-capacitance touch panel according to claim 12, wherein the back-surface electrode is formed of a transparent conductive film.

16. An electrostatic-capacitance touch panel according to claim 12, wherein an area of the individual electrode of the Y electrode is smaller than an area of the individual electrode of the X electrode, and a dummy electrode is arranged close to the individual electrode of the X electrode or the individual electrode of the Y electrode.

* * * * *